US011299646B2

(12) United States Patent
Godard et al.

(10) Patent No.: US 11,299,646 B2
(45) Date of Patent: Apr. 12, 2022

(54) INKJET PRINTING PROCESS

(71) Applicant: LUXEMBOURG INSTITUTE OF SCIENCE AND TECHNOLOGY (LIST), Esch-sur-Alzette (LU)

(72) Inventors: Nicolas Godard, Musson (BE); Daniele Sette, Grenoble (FR); Sebastjan Glinsek, Dudelange (LU); Emmanuel Defay, Esch-sur-Alzette (LU)

(73) Assignee: Luxembourg Institute of Science And Technology (LIST), Esch-sur-Alzette (LU)

( * ) Notice: Subject to any disclaimer, the term of this patent is extended or adjusted under 35 U.S.C. 154(b) by 79 days.

(21) Appl. No.: 16/610,548

(22) PCT Filed: Apr. 27, 2018

(86) PCT No.: PCT/EP2018/060879
§ 371 (c)(1),
(2) Date: Nov. 4, 2019

(87) PCT Pub. No.: WO2018/202576
PCT Pub. Date: Nov. 8, 2018

(65) Prior Publication Data
US 2021/0155817 A1 May 27, 2021

(30) Foreign Application Priority Data
May 5, 2017 (EP) .................................. 17169804
Jun. 2, 2017 (LU) ...................................... 100270

(51) Int. Cl.
*C09D 11/52* (2014.01)
*B41J 2/175* (2006.01)
(Continued)

(52) U.S. Cl.
CPC ........... *C09D 11/52* (2013.01); *B41J 2/17503* (2013.01); *B41M 5/0023* (2013.01); *C09D 11/322* (2013.01); *C09D 11/38* (2013.01)

(58) Field of Classification Search
CPC ... B41J 2/01; B41J 2/211; B41J 2/1433; B41J 2/17; B41J 2/17593; B41J 2/2107;
(Continued)

(56) References Cited

U.S. PATENT DOCUMENTS

2009/0133169 A1* 5/2009 Mirkin ................... B82Y 40/00
850/40
2009/0215208 A1* 8/2009 Coe-Sullivan .... H01L 21/02521
438/22
(Continued)

FOREIGN PATENT DOCUMENTS

JP 2013235902 A 11/2013
WO 2009085678 A1 7/2009

OTHER PUBLICATIONS

International Search Report for corresponding PCT/EP2018/060879, dated Jul. 4, 2018.
(Continued)

*Primary Examiner* — Manish S Shah
(74) *Attorney, Agent, or Firm* — Sandberg Phoenix & von Gontard P.C.

(57) ABSTRACT

An inkjet-printing-base process for depositing functional materials, for example PZT, on a substrate, in various instances platinized silicon. Substrate templating (via SAMs) and material deposition are both performed by an inkjet printing process. Additionally, a composition to be used as a SAM precursor ink which is a thiol in a solvent mixture, wherein the composition can be 1 dodecanethiol in a solvent mixture of 2-methoxyethanol and glycerol.

11 Claims, 3 Drawing Sheets

(51) Int. Cl.
  *B41M 5/00* (2006.01)
  *C09D 11/322* (2014.01)
  *C09D 11/38* (2014.01)

(58) Field of Classification Search
  CPC ...... B41J 2/1755; B41J 2/2114; B41J 2/2117;
    B41J 2/2056; B41J 2/21; B41J 2/0057;
    B41J 3/60; B41J 2002/012; B41J
    2/04598; B41J 2/04588; B41J 2/04595;
    B41J 2/04586; B41J 2/14274; B41J
    2/1623; B41J 2202/00; B41J 2202/03;
    B41J 2/14201; B41J 2/045; B41J
    11/0015; B41J 11/002; B41J 2/04581;
    B41J 2/055; B41J 2/16538; B41J
    2002/16502; B41J 25/001; B41J 25/34;
    B41J 25/003; B41J 25/312; B41J
    2025/008; B41J 2202/21; B41J 2/17596;
    B41J 2/16508; B41J 2/1652; B41J 2/175;
    B41J 2/17563; C09D 11/36; C09D 11/40;
    C09D 11/30; C09D 11/38; C09D 11/32;
    C09D 11/322; C09D 11/324; C09D
    11/328; C09D 11/101; C09D 11/102;
    C09D 11/005; C09D 11/54; C09D 11/52;
    C09D 11/106; B41M 5/0011; B41M
    5/0017; B41M 5/0023; B41M 5/0047;
    B41M 7/00; B41M 7/0072; B41M 5/52;
    B41M 5/5218; B41M 5/5227
  See application file for complete search history.

(56) References Cited

U.S. PATENT DOCUMENTS

| | | | |
|---|---|---|---|
| 2009/0252924 A1* | 10/2009 | Kamikoriyama | C09D 11/52 428/141 |
| 2010/0034986 A1* | 2/2010 | Kodas | C23C 18/06 427/597 |
| 2010/0258968 A1* | 10/2010 | Zu | C09D 11/03 264/134 |
| 2011/0135823 A1* | 6/2011 | Lee | C07F 1/005 427/256 |
| 2013/0153829 A1* | 6/2013 | Kondo | H01B 1/02 252/503 |
| 2013/0162726 A1 | 6/2013 | Mizukami et al. | |
| 2014/0340854 A1* | 11/2014 | Akiyama | H01L 41/332 361/748 |
| 2014/0354745 A1* | 12/2014 | Miyamoto | B41J 11/0015 347/102 |
| 2015/0045515 A1* | 2/2015 | Li | C08G 64/42 525/291 |
| 2015/0290938 A1* | 10/2015 | Rogers | B41J 2/09 347/55 |
| 2017/0130085 A1 | 5/2017 | Kondo | |

OTHER PUBLICATIONS

H. Lee et al: "Templated Inkjet Printing for MEMS", Microsystems Technology Laboratories Annual Research Report; MEMES & BIOMEMS; MS15, 2009.

* cited by examiner

INKJET PRINTING PROCESS

CROSS-REFERENCE TO RELATED APPLICATIONS

The present invention is the US national stage under 35 U.S.C. § 371 of International Application No. PCT/EP2018/060879, which was filed on Apr. 27, 2018, and which claims the priority of application LU 100270 filed on Jun. 2, 2017; and EP 17169804.6, filed on May 5, 2017, the content of which (text, drawings and claims) are incorporated here by reference in its entirety.

FIELD

The invention deals with the field of inkjet printing of functional materials on substrates. In various embodiments, the invention is aimed at printing microsystems, the substrate being at least partially made of platinized silicon.

BACKGROUND

Printing functional materials, in particular functional oxides, on high surface energy materials presents particular difficulties since the ink tends to spread away on the material surface instead of sticking to the precise point where the droplet of ink has been deposited.

To counter-act the spreading of the ink, the surface to be printed is first prepared by deposition of a barrier and then the printed material is applied such that it does only spread within the boundaries of the barrier.

This first step of barrier deposition is commonly described as "templating", since it consists in the realization of a template on the substrate.

Literature proposes two main solutions to limit the spreading of the ink, i.e. hard templates which are physical barriers such as lithographically patterned molds, or soft templates which are chemical barriers such as self-assembled monolayers (SAMs). The present invention focuses on soft templates.

The deposition of soft templates is known to be achieved by photolithography such as described in document U.S. Pat. No. 8,888,253 B2. A whole surface is covered by SAMs and the area to be printed is cleaned from SAMs by a photolithography process. An alternative technology can be micro-contact printing (see H. Lee et al., *MTL Ann. Res. Rep.*, MS15, 2009), wherein a polydimethylsiloxane stamp impregnated with a fluorinated thiol solution is pressed against the substrate.

Alkanethiol self-assembled monolayers (SAMs) can bond to noble metals such as gold, platinum, copper, palladium, iridium and ruthenium. The surface-exposed hydrocarbon chain reduces surface energy and the surface becomes 'hydrophobic' or 'ink-phobic' (ink-repelling).

After the step of deposition of SAMs, the step of printing with the desired functional material is carried out. This is usually done by inkjet printing.

As a consequence, the known techniques employ two technologies, a first technology for the first step (deposition of SAM) and a second technology (i.e. inkjet printing) for the second step (deposition of ink).

Many drawbacks result from this need of two technologies. For instance, the proper positioning of the substrate in the second step which should match perfectly the first step is a difficulty. Furthermore, it lacks practicability and is time, cost and precursor consuming.

SUMMARY OF INVENTION

The present invention aims at improving the known processes of printing functional materials on high surface energy substrates while overcoming the above-mentioned drawbacks.

The stated problem is solved by an only inkjet-printing-based process. In other words, substrate templating and material printing are both processed with the same technology. This is made possible by the development of a SAM precursor ink that is suitable for being printed by inkjet process. In this context of printing of functional materials, known SAMs do not have such properties.

This solution is cost and time efficient, and removes the need to reposition the substrate after the step of templating. As a consequence, the precision of the print is considerably improved.

The stated problem is also solved by the composition of the SAM precursor ink which is a 1-dodecanethiol in a solvent mixture of 2-methoxyethanol and glycerol. In general, alkanethiols are particularly suited for adhering to the substrate. The mixture of a glycol ether and glycerol makes the SAM precursor ink suitable for being printed by inkjet. In particular, this solvent mixture impacts the viscosity of the SAM precursor ink which must be such that it can be contained in an inkjet cartridge and droplets of adequate size can be formed and can adhere to the substrate. Indeed, glycerol is known for its viscous properties, particularly relevant when printing by jetting droplets. During the inkjet process, the SAM precursor ink is also submitted to a temperature at which solvent vapor pressure may be high. A solvent with a too low boiling point would evaporate and would therefore not play its role. The particular composition of the SAM precursor ink according to the invention is made with a solvent with a higher boiling point that makes it suitable for being inkjet-printed.

The problem is also solved by a cartridge for a printing machine, the cartridge containing such a composition.

The invention also relates to the use of such a cartridge, alone, or as a kit with another cartridge containing the functional material, in particular to perform steps of the printing method of the invention.

The invention also relates to the product obtained by the process of the invention. As is explained below, the use of such an only inkjet-printing-based process can be identified on the final product, for instance a microsystem, which has been at least partially manufactured by the said printing process.

Printing Process

According to the invention, the printing process is as prescribed in claim 1.

In an exemplary embodiment, the process comprises furthermore at least one of the following steps:
(c) drying;
(d) pyrolysis;
(e) crystallization;
and in various instances all these steps, performed in that order, and after step (b).

These steps allow to get rid of the SAM material and to synthesize the printed functional material. When all three steps are carried out, an annealing process is achieved.

The steps of drying, pyrolysis and crystallization can be as follows: drying at 130° C. for 3 minutes, pyrolysis at 350° C. for 8 minutes and crystallization at 700° C. for 5 minutes. An optional second step of drying at about 250° C. for about 3 minutes can be applied. The temperatures and the durations of each step depend on the nature of the functional material and the thickness of the layer (i.e. density of droplets printed). The skilled person would know to which extent they can divert from these values while reaching the same effects. Also, for a given functional material, the temperature and duration can be (inversely) varied to obtain the same effects. For instance, drying at ambient temperature is possible but this requires a substantially longer duration than 3 minutes.

In various embodiments, the thickness of a layer of functional material is between 5 and 500 nm, in various instances between 30 and 150 nm, for example from 50 to 90 nm, for instance about 70 nm. The thickness of the layer is governed by the density of droplets printed in step (b). Layers which are thinner than 5 nm would not be continuous, since the droplets of functional material would spread discontinuously on the substrate. Layers which are thicker than 500 nm tend to crack during the drying process.

In an exemplary embodiment, steps (a) to (d) are carried out and are repeated one time or more, defining a cycle, and step (e) is performed after step (d) every n cycle, n being equal or greater than 1, for example n=3 or n=4. Indeed, the crystallization step is not essential for each cycle. This multi-cycle or multi-layer process allows to print a thicker film of functional material.

The SAM may decompose or be degraded due to the annealing process. There is therefore a need to re-deposit SAM at the beginning of each deposition of a new layer.

The volume of the droplets can be from 1 pL to 20 pL, for example 10 pL or 12 pL.

The density of deposition of the functional material can be from 100 droplets/mm$^2$ to 7000 droplets/mm$^2$, for example a few hundreds of droplets, for instance 700±50 droplets/mm$^2$.

The density of deposition of the SAM is such that the distance between two successive drops is less than 40% of the diameter of the drop once it is deposited on the substrate. This serves the purpose of preventing a "jagged edge effect" due to the superimposition of adjacent droplets. Indeed, a small distance between two successive droplets makes it possible to achieve a continuous edge.

The droplets are deposited at a rate of a few thousands of droplets per second, i.e. a rate from 1,000 to 200,000 droplets per second, for example 1,000 to 20,000 droplets per second, for instance 1,000 drops per second.

The pattern of the template defined by the deposition of the SAM can be of any desired shape, form or size. A square-grid pattern is described in the present application as an exemplary embodiment although any other shape, can be printed like a circle or any random closed line. The order of magnitude of the template can be from 10 μm to a few cm. In that sense, the method of the invention is particularly flexible.

In a particularly exemplary embodiment of the printing method, at least one of the steps of drying, pyrolysis or crystallization is carried out within the printing machine. The handling of the substrate between the printing of two successive layers is therefore avoided. To this end, the machine is equipped with heating means such as IR-heating means, laser, photonic annealing or any conventionally known heating means. The structure of the machine is such that it is suitable for resisting to such temperatures. A thermal shield to isolate the substrate or a removable oven can be provided. During these steps, the printing head with the ink is in various instances put at a distance from the substrate being heated, to prevent any risk of deterioration to the ink.

In another exemplary embodiment, the printing method does not make use of cartridges. The printing machine comprises a plurality of tanks, each containing one of the "raw" compositions: alkanethiol, glycol ether, ethylene glycol, glycerol and functional material. The raw compositions are fed to two mixing chambers at desired proportions to obtain the composition of the SAM precursor ink in one chamber and the composition of functional material ink in another chamber. These two (final) compositions are then fed to the printing head. This simplifies the re-filling of the machine by avoiding the need of frequent cartridge replacement. With such an arrangement, the machine can keep on printing and does not need to be stopped to replace an empty cartridge.

Composition of the SAM Precursor Ink

The composition used as SAM precursor ink is a thiol, for example an alkanethiol, for instance 1-dodecanethiol, in a solvent mixture of alcohols and ethers, in various instances glycols, glycol ethers, polyols, polyol ethers, for example 2-methoxyethanol and glycerol and the substrate is made of high surface energy material containing at least a noble metal, for instance a metal of the group Pt, Au, Cu, Ir, Pd, Ru.

In an exemplary embodiment, the composition is made of an alkanethiol in a solvent mixture of 2-methoxyethanol and glycerol. Advantageously, the proportions of the mixture are from 60 to 90 vol % of 2-methoxyethanol, for example from 70 to 80 vol %, for instance about 75 vol %, the complement being glycerol. These proportions give the best results in terms of aptitude to be inkjet-printed.

In an exemplary embodiment, the alkanethiol is 1-dodecanethiol $CH_3(CH_2)_{11}SH$, in various instances in a quantity of 0.1 to 0.00001 M in the solvent, for example 0.01 to 0.0001 M, for instance 0.001 M. 1-Dodecanethiol has particularly good properties to adhere to high surface energy metals.

Other similar solvents or alkanethiols (described by the general formula RSH where R is $C_nH_{2n+1}$) can be used.

Composition of the Functional Material

Concerning the material to be deposited on the substrate, an exemplary embodiment of the invention concerns PZT ink $(Pb(Zr,Ti)O_3)$. The PZT ink consists of a standard chemical solution deposition (CSD or sol-gel) material modified with solvents.

A specific exemplary embodiment of the PZT ink can be a PZT ink that has a near-morphotropic-phase-boundary composition (MPB). A mixture of dehydrated lead(II) acetate, zirconium(IV) butoxide and titanium(IV) isopropoxide in 2-methoxyethanol with 10% excess lead is heated at reflux during two hours to ensure homogenization and stabilization of alkoxide species via ligand exchange. The resulting PZT solution is then diluted to 0.2 M with ethylene glycol and glycerol to adjust ink viscosity and surface tension for efficient droplet ejection using cartridges commercially available such as Dimatix®.

In an exemplary embodiment, the PZT ink is diluted in 65 (±5) vol % 2-methoxyethanol, 25 (±5) vol % glycerol and 10 (±5) vol % ethylene glycol.

Alternatively, the functional material can be PLZT $((Pb,La)(Zr,Ti)O_3)$, $PbTiO_3$, $PbZrO_3$, $Pb(Mg,Nb,Ti)O_3$, $BaTiO_3$, $(Ba,Ca)(Ti,Zr)O_3$ or any equivalent.

Substrate

Concerning the material of the substrate, the invention aims at printing on any material with high surface energy containing at least a metal and compatible with the formation of SAMs such as materials comprising Pt, Au, Cu, Ir, Pd, Ru or any material with similar properties. This material can be deposited on silicon, glass, steel or polymer. The most preferable material for the substrate to be printed by the disclosed invention is platinized silicon.

Platinum has very high surface energy (~1 J m$^{-2}$). Due to extreme wetting, the direct deposition of functional materials by inkjet printing of organic solvent-based inks is inadequate. Other noble metals can present similar properties.

Cartridges

The invention also relates to a printing cartridge containing the templating ink, i.e. the composition aimed at being used as SAM precursor ink.

The invention also relates to a kit of at least one such cartridge and at least one cartridge containing the functional material.

The cartridges can have a capacity of 3 mL and the size of the nozzle can be of 21 µm. Other cartridges can be used according to the machine used or the size or shape of the pattern/print to be achieved.

The cartridge for the template ink and the cartridge for the functional material ink can be identical. They can also be different. Indeed, a bigger cartridge can be used for the functional material, such that, for instance, the replacement of the two cartridges can occur simultaneously.

The printing method of an exemplary embodiment of the invention can make use of more than two cartridges. For instance, there can be more than one cartridge of one particular material for consumption reasons, to avoid any maintenance when depositing a high volume of material.

Alternatively or complementarily, there can also be more than two materials involved. For instance, when depositing several layers, two successive layers of functional material or two successive layers of SAM can be made of different materials. There are therefore at least three cartridges comprising three different compositions. The kit of the invention can include these three cartridges.

This technique makes it possible to print superior layers of electrodes. These printed top electrodes can be made of Ag, Cu, Pt or ITO (indium tin oxide). All these materials are known to be printable.

Product

The particular, but not exhaustive applications of the printing process of the invention are microsystems, passive capacitors, silicon wafers or integrated piezoelectric devices. For instance, the method of the invention can be used to print a series of piezoelectric actuators spaced from each other of 50 microns.

The invention also relates to the final product resulting from the printing process. Analyses have shown that the final product can have similar electrical properties as a microsystem obtained by the known methods. Secondary ion mass spectrometry (SIMS) analysis shows however that a product directly obtained by the method of the invention exhibits traces of sulfur in the functional material film. The presence of sulfur was detected across the whole thickness of a crystallized PZT film. A higher concentration of sulfur was however found at the edge of the printed PZT pattern. It could be ascribed to the diffusion of thiols in the functional material film, due to the coexistence of both inks in the liquid state after printing. The templating lines contain a relatively large amount of residual solvent and non-grafted thiols that can diffuse in the liquid film of functional material. Thiols used for substrate templating are the only possible source of sulfur since they are the only sulfur-containing species used in the whole process.

As a consequence, by performing a SIMS analysis on a product, one can identify whether a particular product has been produced by the printing method of the invention.

DRAWINGS

DETAILED DESCRIPTION

Figure 1:
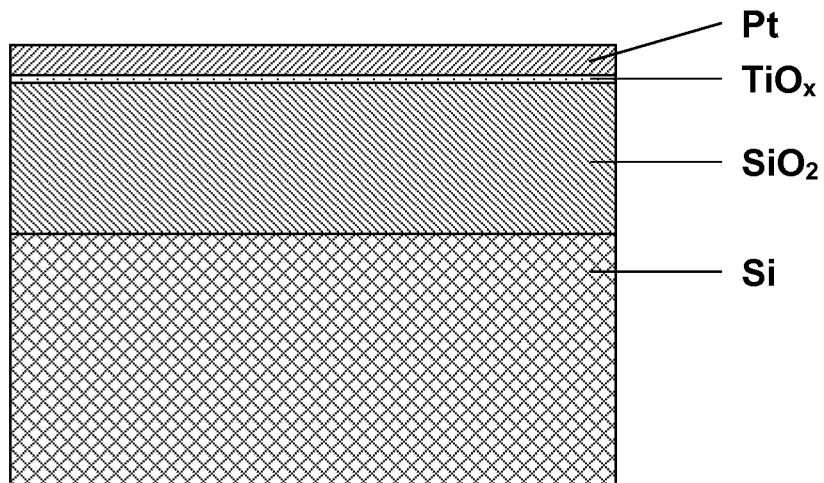
FIG. 1 is a cross section of a substrate, in accordance with various embodiments of the present invention.

FIG. 1 shows a cross section (not to scale) of a substrate that can be used for the printing process of the invention. In various embodiments, the substrate can comprise a silicon base with a platinum coating.

Figure 2:
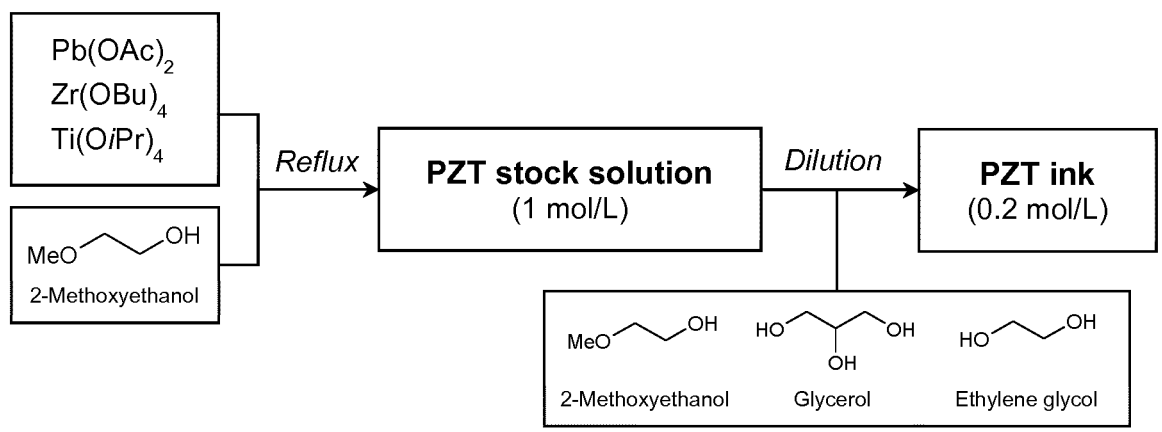
FIG. 2 is a diagram summarizing the preparation of a functional material, in accordance with various embodiments of the present invention.

FIG. 2 details the process employed to obtain a functional material. In this example, PZT ink is obtained after reflux and dilution.

A mixture of dehydrated lead(II) acetate, zirconium(IV) butoxide and titanium(IV) isopropoxide in 2-methoxyethanol with 10% excess lead is heated at reflux during two hours to ensure homogenization and stabilization of alkoxide species via ligand exchange. The resulting PZT sol is then diluted to 0.2 M with ethylene glycol and glycerol to adjust ink viscosity and surface tension for efficient droplet ejection. For instance, the PZT can be diluted in 65 vol % 2-methoxyethanol, 25 vol % glycerol and 10 vol % ethylene glycol.

Figure 3:
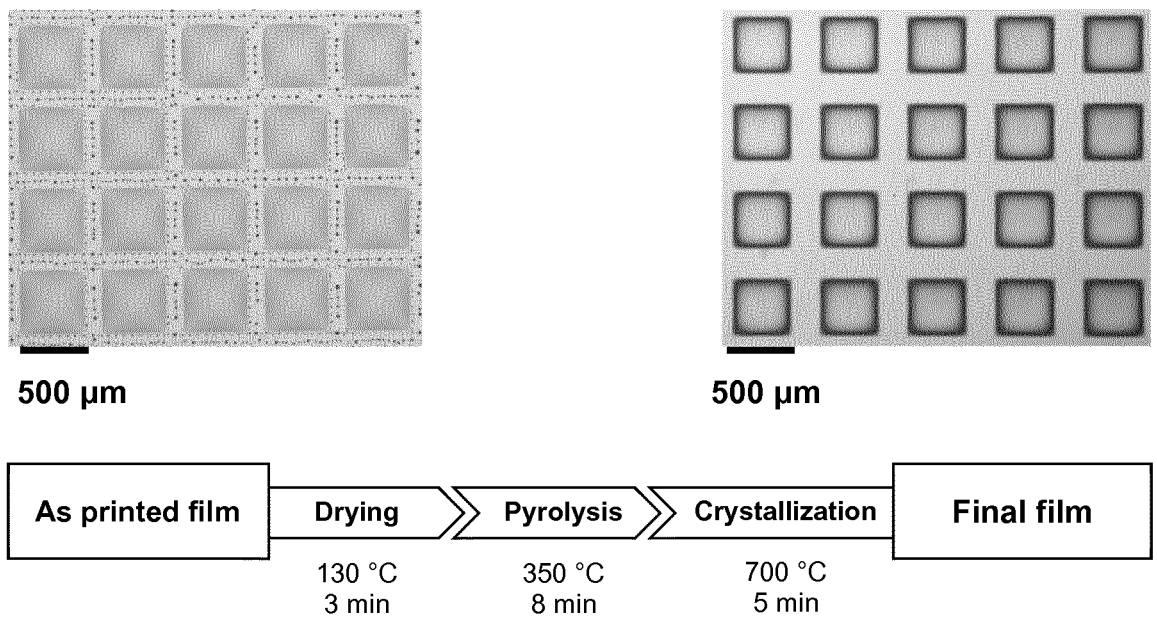
FIG. 3 illustrates an exemplary embodiment of the printing method, in accordance with various embodiments of the present invention.

FIG. 3 shows an example of pattern/template and a particular printing process according to an exemplary embodiment of the invention. A grid-like pattern is printed with SAMs (step (a) of the printing process). In practice, a first series of parallel lines is printed and then a second series of parallel lines perpendicular to the first series is printed. Then the functional material is printed within the boundaries of the grid-like pattern (step (b) of the printing process).

In a particular example, the steps of drying, pyrolysis and crystallization are applied to obtain a final (dry) film on the substrate, as illustrated on the right side of FIG. 3.

In a particular example of a product obtained by the invention, the two-step full-inkjet-printing process has been used to fabricate an array of 500×500 µm$^2$ PZT squares. The obtained 80 nm-thick structures are crystallized in perovskite phase.

Figure 4:
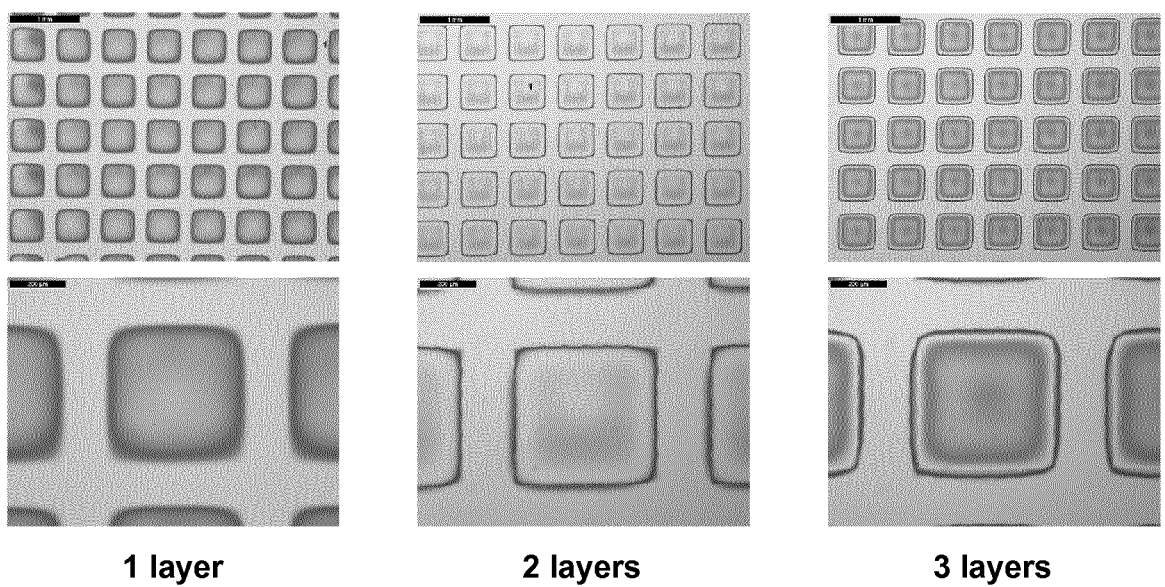
FIG. 4 illustrates top view pictures of the printed pattern of films, in accordance with various embodiments of the present invention.

FIG. 4 shows pictures taken with an optical microscope of the films that can be obtained after multi-layer printing process. The printing steps of FIG. 3 are repeated. They are carried out in the same area of the substrate to build one layer at a time. This means that a precise repositioning of the printing head relative to the substrate for each new layer is performed.

Figure 5:
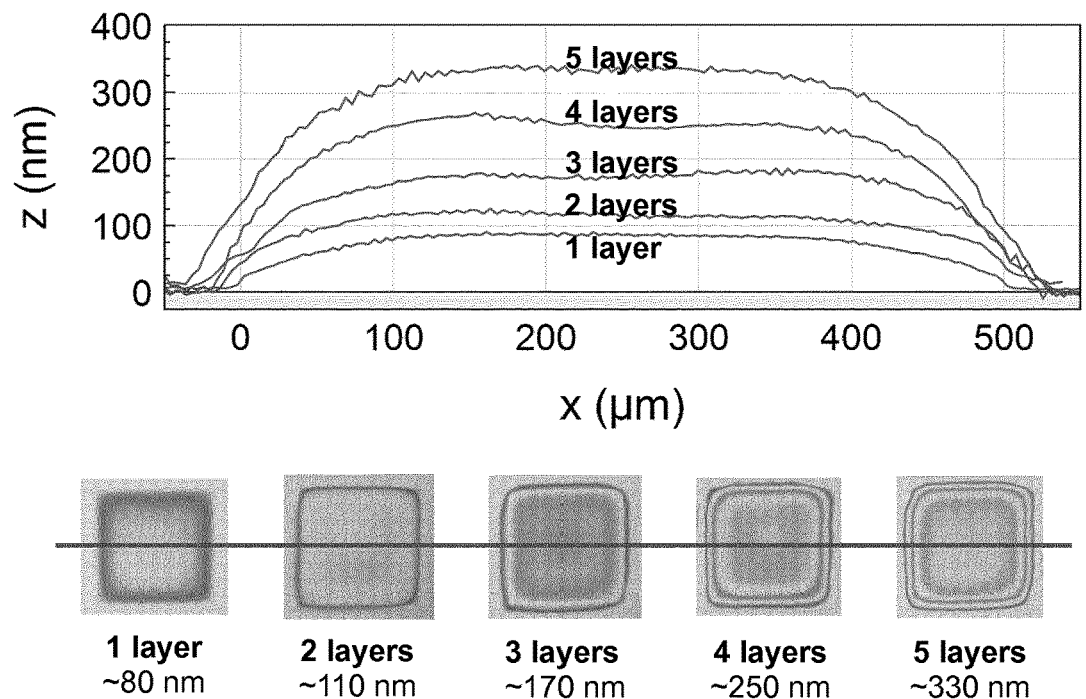
FIG. 5 shows the thickness of the deposition, in accordance with various embodiments of the present invention.

FIG. 5 shows the thickness profile of one of the squares. The measurement of the thickness was made after crystallization of each of the successive layers and prior to printing the next layer. We can see regular thickness along the transverse direction of the square. We can also see that the method of the invention allows a precise positioning of the layers one onto each other. Of course, by varying the density of droplets from one layer to another layer, or varying the functional material, a wide variety of heterogenous products can be printed.

Figure 6:
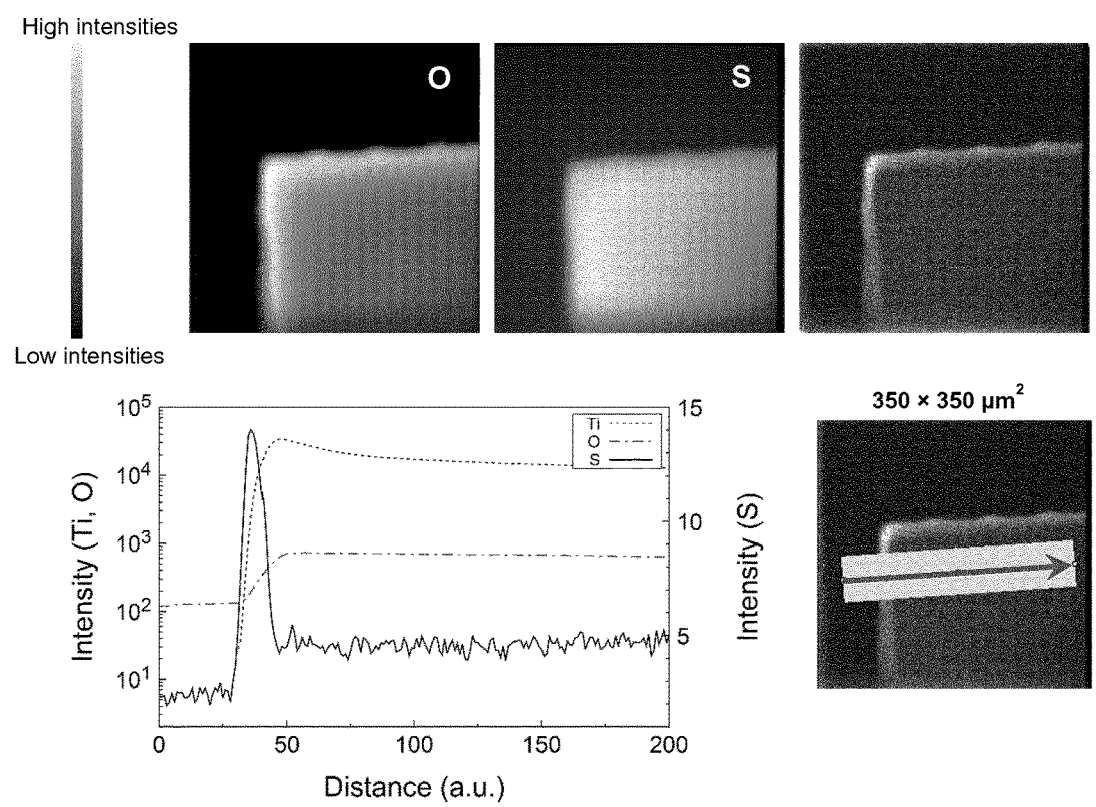
FIG. 6 shows the results of a SIMS analysis, in accordance with various embodiments of the present invention.

FIG. 6 shows the results of the SIMS analysis (imaging mode) of a film realized with the printing method of the invention. An elemental mapping of titanium, oxygen and sulfur was performed in the edge area of a printed PZT square. Sulfur was mostly detected at the edge of the PZT square.

Both the functional material and the SAM precursor inks were liquid and were in contact with each other during the printing process. The sulfur detected in the layer of functional material can only originate from thiols that have diffused into the functional material precursor ink while both were in liquid state. Such diffused sulfur is not observed when SAMs are deposited by any other method because in these known methods, the liquid functional material ink is only printed once the SAM is formed and there is no residual liquid on the substrate.

Although the printing process, the composition of the SAM, the composition of the functional material, the substrate material and the cartridges have been described in details in separate paragraphs of the description, it has to be noted that each particular embodiment of one of these elements is combinable with each particular embodiment of another one of these elements.

The invention claimed is:

1. An Inkjet printing process of printing a functional material on a substrate, said process comprising:
    (a) depositing a self-assembled monolayer (SAM) template having a particular pattern on the substrate via inkjet printing, wherein the inkjet-printed SAM template pattern defines boundaries for the deposition of a functional material; and
    (b) depositing the functional material within the boundaries of the inkjet-printed SAM template pattern, the functional material being a composition containing PZT ($Pb(Zr,Ti)O_3$), PLZT (($Pb,La)(Zr,Ti)O_3$), $PbTiO_3$, $PbZrO_3$, $Pb(Mg,Nb,Ti)O_3$, $BaTiO_3$, or $(Ba,Ca)(Ti,Zr)O_3$ in a solvent consisting in 2-methoxyethanol, glycerol and ethylene glycol.

2. The printing process according to claim 1, wherein depositing a SAM template via inkjet printing comprises inkjet printing a SAM ink that is a composition made of a thiol in a solvent mixture of alcohols and ethers, and the substrate is made of a high surface energy material containing at least a noble metal of the group Pt, Au, Cu, Ir, Pd, Ru.

3. The printing process according to claim 2, wherein the thiol is 1-dodecanethiol and the solvent mixture of alcohols and ethers is 2-methoxyethanol and glycerol.

4. The printing process according to claim 3, wherein the solvent mixture of alcohols and ethers is made of 60 to 90 vol % of 2-methoxyethanol, and the remaining vol % is glycerol.

5. The printing process according to claim 4, wherein the vol % of 2-methoxyethanol is about 75%.

6. The printing process according to claim 3, wherein the quantity of thiol in the solvent mixture of alcohols and ethers is of 0.1 to 0.00001 M.

7. The printing process according to claim 6, wherein the quantity of thiol in the solvent mixture of alcohols and ethers is of about 0.001 M.

8. The printing process according to claim 1, wherein the composition containing PZT consists in PZT diluted to 0.2 M in the solvent, which is made of 65 (±5) vol % 2-methoxyethanol, 25 (±5) vol % glycerol and 10 (±5) vol % ethylene glycol.

9. The printing process according to claim 1, further comprising the following steps, in that order:
    (c) drying;
    (d) pyrolysis;
    (e) crystallization.

10. The printing process according to claim 9, wherein the steps (a) to (d) are repeated one time or more, thus defining a cycle, and step (e) is performed after step (d) every n cycle, n being equal or greater than 1, such that a multi-layer functional material is printed on the substrate.

11. The printing process of claim 1 further comprising utilizing the process to make a microsystem.

* * * * *